US010850841B2

(12) United States Patent
Bonden et al.

(10) Patent No.: US 10,850,841 B2
(45) Date of Patent: Dec. 1, 2020

(54) UNMANNED AERIAL VEHICLE AND METHOD FOR OPERATING AN UNMANNED AERIAL VEHICLE

(71) Applicant: Intel Corporation, Santa Clara, CA (US)

(72) Inventors: Marko Bonden, Tampere (FI); Andres Lorvi, Tampere (FI)

(73) Assignee: INTEL CORPORATION, Santa Clara, CA (US)

( * ) Notice: Subject to any disclaimer, the term of this patent is extended or adjusted under 35 U.S.C. 154(b) by 9 days.

(21) Appl. No.: 16/012,820

(22) Filed: Jun. 20, 2018

(65) Prior Publication Data

US 2019/0047699 A1 Feb. 14, 2019

(51) Int. Cl.
*B64C 39/02* (2006.01)
*G05D 1/00* (2006.01)
(Continued)

(52) U.S. Cl.
CPC ........ *B64C 39/024* (2013.01); *F28D 15/0266* (2013.01); *F28D 15/0275* (2013.01); *F28D 15/06* (2013.01); *F28D 20/021* (2013.01); *G05D 1/0011* (2013.01); *G05D 1/0055* (2013.01); *G08G 5/0013* (2013.01); *G08G 5/0021* (2013.01); *G08G 5/0069* (2013.01); *G08G 5/04* (2013.01); *G08G 5/045* (2013.01); *H01L 23/34* (2013.01); *H01L 23/467* (2013.01); *H01M 10/48* (2013.01); *H01M 10/613* (2015.04); *H01M 10/625* (2015.04);
(Continued)

(58) Field of Classification Search
CPC ............ B64C 39/024; B64C 2201/141; B64C 2201/146; H04N 5/232411; H04N 5/23229; F28D 15/06; G05D 1/0011; G05D 1/0055; G08G 5/04
See application file for complete search history.

(56) References Cited

U.S. PATENT DOCUMENTS

2008/0034232 A1* 2/2008 Rangarajan ............. G06F 1/206
713/300
2011/0205703 A1* 8/2011 Weaver .................. G03B 17/55
361/695
(Continued)

*Primary Examiner* — Aaron L Troost
(74) *Attorney, Agent, or Firm* — Viering, Jentschura & Partner mbb

(57) ABSTRACT

Unmanned aerial vehicles and methods for unmanned aerial vehicles are described in various aspects herein. In at least one aspect, an unmanned aerial vehicle (UAV) includes a cooling structure configured to dissipate heat, and an air channel configured to dissipate heat from the cooling structure via an airflow. The UAV also includes at least one fan configured to provide the airflow through the air channel, and one or more sensors configured to receive ambient condition information associated with an ambient condition in a vicinity of the UAV. The UAV further includes one or more processors configured to trigger a reduction of the airflow through the air channel based on the ambient condition information. The ambient condition information may include dust information indicating a dust pollution in the vicinity of the UAV. Additionally or alternatively, the ambient condition information may include weather information indicating rain in the vicinity of the UAV.

20 Claims, 7 Drawing Sheets

(51) Int. Cl.
| | |
|---|---|
| *G08G 5/04* | (2006.01) |
| *H04N 5/232* | (2006.01) |
| *F28D 15/06* | (2006.01) |
| *F28D 15/02* | (2006.01) |
| *H01L 23/467* | (2006.01) |
| *H01M 10/48* | (2006.01) |
| *H01L 23/34* | (2006.01) |
| *H01M 10/6552* | (2014.01) |
| *F28D 20/02* | (2006.01) |
| *H01M 10/659* | (2014.01) |
| *H01M 10/6562* | (2014.01) |
| *G08G 5/00* | (2006.01) |
| *H01M 10/635* | (2014.01) |
| *H01M 10/613* | (2014.01) |
| *H01M 10/625* | (2014.01) |
| *F28D 21/00* | (2006.01) |
| *F28D 20/00* | (2006.01) |

(52) U.S. Cl.
CPC ....... *H01M 10/635* (2015.04); *H01M 10/659* (2015.04); *H01M 10/6552* (2015.04); *H01M 10/6562* (2015.04); *H04N 5/23229* (2013.01); *H04N 5/23299* (2018.08); *H04N 5/232411* (2018.08); *B64C 2201/141* (2013.01); *B64C 2201/146* (2013.01); *F28D 2020/0013* (2013.01); *F28D 2021/0029* (2013.01); *H01M 2220/20* (2013.01)

(56) References Cited

U.S. PATENT DOCUMENTS

| | | | |
|---|---|---|---|
| 2017/0102187 A1* | 4/2017 | Anderl | F16K 31/002 |
| 2017/0205826 A1* | 7/2017 | Smith | G05D 1/0094 |
| 2018/0002023 A1* | 1/2018 | Tian | B64C 39/024 |
| 2019/0230801 A1* | 7/2019 | Neuman | H05K 7/20845 |
| 2020/0102061 A1* | 4/2020 | Cai | B64C 1/00 |

\* cited by examiner

UNMANNED AERIAL VEHICLE AND METHOD FOR OPERATING AN UNMANNED AERIAL VEHICLE

TECHNICAL FIELD

Various aspects relate generally to an unmanned aerial vehicle and a method for operating an unmanned aerial vehicle.

BACKGROUND

An unmanned aerial vehicle (UAV) may have a one or more processors to control flight of the unmanned aerial vehicle along a predefined flight path. The one or more processors to control flight of the unmanned aerial vehicle may be also referred to as a flight controller or may be part of a flight controller. The predefined flight path may be provided and/or modified, for example, by manual remote control, waypoint control, target tracking, etc. Further, an obstacle detection and avoidance system may be implemented to avoid collision of the unmanned aerial vehicle with an obstacle located in the predefined flight path of the unmanned aerial vehicle. As an example, an unmanned aerial vehicle with obstacle detection may be configured to stop in front of a solid object, as for example, a wall, a tree, a pillar, etc., and thus avoid a collision. As an example, the obstacle detection may be based on at least one imaging system and the unmanned aerial vehicle may include one or more processors associated with the at least one imaging system.

BRIEF DESCRIPTION OF THE DRAWINGS

Throughout the drawings, it should be noted that like reference numbers are used to depict the same or similar elements, features, and structures. The drawings are not necessarily to scale, emphasis instead generally being placed upon illustrating aspects of the disclosure. In the following description, some aspects of the disclosure are described with reference to the following drawings, in which.

DESCRIPTION

Figure 1:
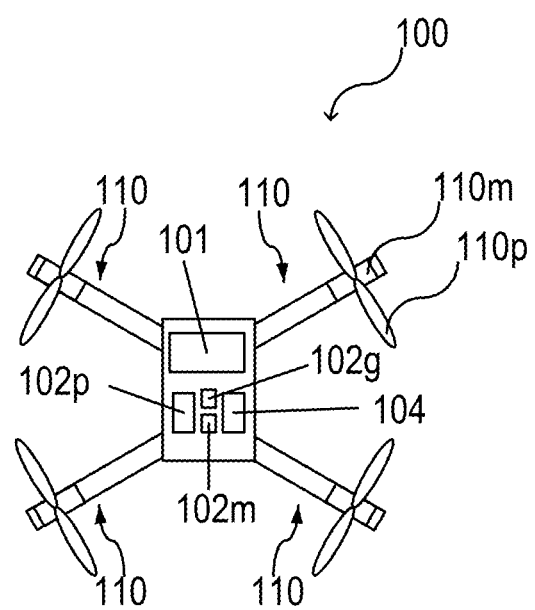
FIG. 1 shows an unmanned aerial vehicle in a schematic view, according to various aspects.

The following detailed description refers to the accompanying drawings that show, by way of illustration, specific details and aspects in which the disclosure may be practiced. One or more aspects are described in sufficient detail to enable those skilled in the art to practice the disclosure. Other aspects may be utilized and structural, logical, and/or electrical changes may be made without departing from the scope of the disclosure. The various aspects of the disclosure are not necessarily mutually exclusive, as some aspects can be combined with one or more other aspects to form new aspects. Various aspects are described in connection with methods and various aspects are described in connection with devices. However, it may be understood that aspects described in connection with methods may similarly apply to the devices, and vice versa.

The term "exemplary" may be used herein to mean "serving as an example, instance, or illustration". Any aspect or design described herein as "exemplary" is not necessarily to be construed as preferred or advantageous over other aspects or designs.

The terms "at least one" and "one or more" may be understood to include a numerical quantity greater than or equal to one (e.g., one, two, three, four, [ . . . ], etc.). The term "a plurality" may be understood to include a numerical quantity greater than or equal to two (e.g., two, three, four, five, [ . . . ], etc.).

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The words "plural" and "multiple" in the description and the claims expressly refer to a quantity greater than one. Accordingly, any phrases explicitly invoking the aforementioned words (e.g., "a plurality of [objects]," "multiple [objects]") referring to a quantity of objects expressly refers more than one of the said objects. The terms "group (of)," "set [of]," "collection (of)," "series (of)," "sequence (of)," "grouping (of)," etc., and the like in the description and in the claims, if any, refer to a quantity equal to or greater than one, i.e. one or more.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term data, however, is not limited to the aforementioned examples and may take various forms and represent any information as understood in the art. Any type of information, as described herein, may be handled for example via a one or more processors in a suitable way, e.g. as data.

The terms "processor" or "controller" as, for example, used herein may be understood as any kind of entity that allows handling data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "memory" detailed herein may be understood to include any suitable type of memory or memory device, e.g., a hard disk drive (HDD), a solid-state drive (SSD), a flash memory, etc.

Differences between software and hardware implemented data handling may blur. A processor, controller, and/or circuit detailed herein may be implemented in software, hardware and/or as hybrid implementation including software and hardware.

The term "system" (e.g., a sensor system, a control system, a computing system, etc.) detailed herein may be understood as a set of interacting elements, wherein the elements can be, by way of example and not of limitation, one or more mechanical components, one or more electrical components, one or more instructions (e.g., encoded in storage media), and/or one or more processors, and the like.

The term "position" used with regard to a "position of an unmanned aerial vehicle", "position of an object", "position of an obstacle", and the like, may be used herein to mean a point or region in a two- or three-dimensional space. It is understood that suitable coordinate systems with respective reference points are used to describe positions, vectors, movements, and the like. The term "flight path" used with regard to a "predefined flight path", a "traveled flight path", a "remaining flight path", and the like, may be understood as a trajectory in a two- or three-dimensional space. The flight path may include a series (e.g., a time-resolved series) of positions along which the unmanned aerial vehicle has traveled, a respective current position, and/or at least one target position towards which the unmanned aerial vehicle is traveling. The series of positions along which the unmanned aerial vehicle has traveled may define a traveled flight path. The current position and the at least one target position may define a remaining flight path.

The term "map" used with regard to a two- or three-dimensional map may include any suitable way of describing positions of objects in the two- or three-dimensional space.

According to various aspects, a voxel map may be used to describe objects in the three dimensional space based on voxels associated with objects. To prevent collision based on a voxel map, ray-tracing, ray-casting, rasterization, etc., may be applied to the voxel data.

An unmanned aerial vehicle (UAV) is an aircraft that has the capability of autonomous flight. In autonomous flight, a human pilot is not aboard and in control of the unmanned aerial vehicle. The unmanned aerial vehicle may also be denoted as an unstaffed, uninhabited or unpiloted aerial vehicle, -aircraft or -aircraft system or drone.

The unmanned aerial vehicle, according to various aspects, may include a support frame that serves as a basis for mounting components of the unmanned aerial vehicle, such as, for example, motors, sensors, mechanic, transmitter, receiver, and any type of control to control the functions of the unmanned aerial vehicle as desired. One or more of the components mounted to the support frame may be at least partially surrounded by a shell (also referred to as body, hull, outer skin, etc.). As an example, the shell may mechanically protect the one or more components. Further, the shell may be configured to protect the one or more components from moisture, dust, radiation (e.g. heat radiation), etc.

The unmanned aerial vehicle, according to various aspects, may include a camera gimbal having an independent two- or three-axis degree of freedom to properly track a target, e.g. a person or point of interest, with a tracking camera independently of an actual flight direction or actual attitude of the unmanned aerial vehicle. In some aspects, a depth camera may be used for tracking, monitoring the vicinity, providing images to a user of the unmanned aerial vehicle, etc. A depth camera may allow the association of depth information with an image, e.g., to provide a depth image. This allows, for example, the ability to provide an image of the vicinity of the unmanned aerial vehicle including depth information about one or more objects depicted in the image.

As an example, a depth image may include information to indicate a relative distance of objects displayed in the image. This distance information may be, but is not limited to, colors and/or shading to depict a relative distance from a sensor. Positions of the objects may be determined from the depth information. Based on depth images, a three dimensional map may be constructed from the depth information. Said map construction may be achieved using a depth map engine, which may include one or more processors or a non-transitory computer readable medium configured to create a voxel map (or any other suitable map) from the depth information provided by the depth images. According to various aspects, a depth image may be obtained by a stereo camera, e.g., calculated from two or more images having a different perspective.

The unmanned aerial vehicle, according to various aspects, includes at least one sensor for obstacle detection, e.g. only one sensor, two sensors, or more than two sensors. The at least one sensor can be fixedly mounted on the support frame of the unmanned aerial vehicle. Alternatively, the at least one sensor may be fixed to a movable mounting structure so that the at least one sensor may be aligned into a desired direction.

According to various aspects, an unmanned aerial vehicle may have a heading direction. The heading direction may be understood as a reference direction assigned with a straightforward flight direction.

The unmanned aerial vehicle described herein can be in the shape of an airplane (e.g. a fixed wing airplane) or a copter (e.g. multi rotor copter), i.e. a rotorcraft unmanned aerial vehicle, e.g. a quad-rotor unmanned aerial vehicle, a hex-rotor unmanned aerial vehicle, an octo-rotor unmanned aerial vehicle. The unmanned aerial vehicle described herein may include a plurality of rotors (e.g., three, four, five, six, seven, eight, or more than eight rotors), also referred to as propellers. Each of the propellers has one or more propeller blades. In some aspects, the propellers may be fixed pitch propellers.

The unmanned aerial vehicle may be configured to operate with various degrees of autonomy: under remote control by a human operator, or fully or intermittently autonomously, by onboard computers. The unmanned aerial vehicle may be configured to lift-off (also referred to as take-off) and land autonomously in a lift-off and/or a landing operation mode. Alternatively, the unmanned aerial vehicle may be controlled manually by a radio control (RC) at lift-off and/or landing. The unmanned aerial vehicle may be configured to fly autonomously based on a flight path. The flight path may be a predefined flight path, for example, from a starting point or a current position of the unmanned aerial vehicle to a target position, or, the flight path may be variable, e.g., following a target that defines a target position. In some aspects, the unmanned aerial vehicle may switch into a GPS-guided autonomous mode at a safe altitude or safe distance. The unmanned aerial vehicle may have one or more fail-safe operation modes, e.g., returning to the starting point, landing immediately, etc. In some aspects, the unmanned aerial vehicle may be controlled manually, e.g., by a remote control during flight, e.g. temporarily.

In general, an unmanned aerial vehicle may include one or more electronic devices that may need to be temperature controlled and protected from water and dust ingress. As an example, a high performance computing device (e.g. a chip or system on chip, a controller, etc.) may require an active cooling which means the system may need a fan (also referred to as a blower). An unmanned aerial vehicle may need to operate in a dusty environment especially during takeoff and landing and sometimes in rainy weather conditions as well. According to various aspects, the active thermal cooling of one or more electronic devices of the unmanned aerial vehicle may be reduced or disabled to prevent dust and water ingress. At the same time, a performance scaling for the one or more electronic devices may be implemented during these challenging occasions to at least partially compensate for the reduction of the cooling performance. Thus, it may be avoided that dust and/or water (or other solid or liquid particles) may enter the interior of the unmanned aerial vehicle and affect one or more of the components inside the unmanned aerial vehicle (i.e. disposed inside the shell).

In the following, an unmanned aerial vehicle is described in more detail. The unmanned aerial vehicle may be configured to allow a performance scaling related to one or more computing functions that are associated with one or more electronic devices of the unmanned aerial vehicle; different weather conditions (or other ambient conditions in a vicinity of the unmanned aerial vehicle) may be considered in the performance scaling. The performance scaling may be carried out in correlation with a reduction of an airflow that may be used for cooling the respective one or more electronic devices.

As an example, the payload (e.g. camera system) performance may be scaled down when the unmanned aerial vehicle is near the ground and/or detects rain. Scaling down the performance may enable scaling down or stopping the active cooling system (e.g. cooling fan) to prevent dust and water intake.

According to various aspects, a performance scaling may include, for example, limiting computing tasks, e.g. camera frame rate or camera resolution, and/or preventing certain functions from running, for example collision avoidance tasks may be needed only in the flight direction and not in every direction. In addition, a fail-safe and/or warning system may be implemented to perform controlled shutdown or power limiting of functions.

According to various aspects, an unmanned aerial vehicle is provided that may have a prolonged lifetime, an improved thermal performance (e.g. during a mission), since, for example, less dust protection may be needed at the air inlet of the active cooling system. As an example, the air inlet of the active cooling system may be free of a dust filter or any similar dust protection structure.

According to various aspects, the unmanned aerial vehicle may receive (e.g., determine, sense, etc.) information about its vicinity in order to determine an appropriate operation mode for the active cooling system to prevent a substantial dust and water intake into the unmanned aerial vehicle. In some aspects, the received information (e.g. related to dusty areas, current weather conditions, etc.) may be included in a map. The map may represent the vicinity of the unmanned aerial vehicle and the respective information based on geometric data, point clouds, voxels, or other representations. In the following, various configurations of the unmanned aerial vehicle and various functionalities may be described for voxels, a voxel map, and ray tracing. However, alternatively or additionally, other suitable representations may be used as well.

Various aspects may be related to the determination of the ambient condition information that may include, for example, dust information representing a dust pollution in the vicinity of the unmanned aerial vehicle and/or weather information representing rain (or, in general, humidity) in the vicinity of the unmanned aerial vehicle. However, in a similar way, position information (e.g. obtained by any suitable positioning system, e.g. GPS) may be correlated with the ambient condition information, wherein in this case the position information may be used to select an appropriate operational mode for the active cooling system (e.g. to trigger a reduction of the airflow of the active cooling system, etc.).

According to various aspects, a map may be used to store position information and/or the ambient condition information in a suitable form of data that allows controlling one or more operations of the unmanned aerial vehicle based on the map. However, other suitable implementations may be used to allow control of the unmanned aerial vehicle based on at least the movement data.

FIG. 1 illustrates an unmanned aerial vehicle 100 in a schematic view, according to various aspects. The unmanned aerial vehicle 100 may include a plurality of (e.g., three or more than three, e.g., four, six, eight, etc.) vehicle drive arrangements 110. Each of the vehicle drive arrangements 110 may include at least one drive motor 110$m$ and at least one propeller 110$p$ coupled to the at least one drive motor 110$m$. According to various aspects, the one or more drive motors 110$m$ of the unmanned aerial vehicle 100 may be electric drive motors. Therefore, each of the vehicle drive arrangements 110 may be also referred to as electric drive or electric vehicle drive arrangement.

Further, the unmanned aerial vehicle 100 may include one or more processors 102$p$ configured to control flight or any other operation of the unmanned aerial vehicle 100. One or more of the processors 102$p$ may be part of a flight controller or may implement a flight controller. The one or more processors 102$p$ may be configured, for example, to provide a flight path based at least on a current position of the unmanned aerial vehicle 100 and a target position for the unmanned aerial vehicle 100. In some aspects, the one or more processors 102$p$ may control the unmanned aerial vehicle 100 based on the map, as described in more detail below. In some aspects, the one or more processors 102$p$ may directly control the drive motors 110$m$ of the unmanned aerial vehicle 100, so that in this case no additional motor controller may be used. Alternatively, the one or more processors 102$p$ may control the drive motors 110$m$ of the unmanned aerial vehicle 100 via one or more additional motor controllers. The motor controllers may control a drive power that may be supplied to the respective motor. The one or more processors 102$p$ may include or may implement any type of controller suitable for controlling the desired functions of the unmanned aerial vehicle 100. The one or more processors 102$p$ may be implemented by any kind of one or more logic circuits.

According to various aspects, the unmanned aerial vehicle 100 may include one or more memories 102m. The one or more memories may be implemented by any kind of one or more electronic storing entities, e.g. a one or more volatile memories and/or one or more non-volatile memories. The one or more memories 102m may be used, e.g., in interaction with the one or more processors 102p, to build and/or store the map, according to various aspects.

Further, the unmanned aerial vehicle 100 may include one or more power supplies 104. The one or more power supplies 104 may include any suitable type of power supply, e.g., a directed current (DC) power supply. A DC power supply may include one or more batteries (e.g., one or more rechargeable batteries), etc.

According to various aspects, the unmanned aerial vehicle 100 may include one or more sensors 101. The one or more sensors 101 may be configured to monitor a vicinity of the unmanned aerial vehicle 100. The one or more sensors 101 may be configured to detect obstacles in the vicinity of the unmanned aerial vehicle 100. According to various aspects, the one or more processors may be further configured to modify a predefined flight path of the unmanned aerial vehicle 100 based on detected obstacles to generate a collision free flight path to the target position avoiding obstacles in the vicinity of the unmanned aerial vehicle. According to various aspects, the one or more processors may be further configured to reduce altitude of the unmanned aerial vehicle 100 to avoid a collision during flight, e.g., to prevent a collision with a flying object approaching unmanned aerial vehicle 100 on a collision course. As an example, if the unmanned aerial vehicle 100 and the obstacle may approach each other and the relative bearing remains the same over time, there may be a likelihood of a collision.

The one or more sensors 101 may include, for example, one or more cameras (e.g., a depth camera, a stereo camera, etc.), one or more ultrasonic sensors, one or more radar (radio detection and ranging) sensors, one or more lidar (light detection and ranging) sensors, etc. The one or more sensors 101 may include, for example, any other suitable sensor that allows a detection of an object and the corresponding position of the object. The unmanned aerial vehicle 100 may further include a position detection system 102g. The position detection system 102g may be based, for example, on global positioning system (GPS) or any other available positioning system. Therefore, the one or more processors 102p may be further configured to modify a predefined flight path of the unmanned aerial vehicle 100 based on data obtained from the position detection system 102g. The position detection system 102g may be used, for example, to provide position and/or movement data of the unmanned aerial vehicle 100 itself (including a position, e.g., a direction, a speed, an acceleration, etc., of the unmanned aerial vehicle 100). However, other sensors (e.g., image sensors, a magnetic sensor, etc.) may be used to provide position and/or movement data of the unmanned aerial vehicle 100. The position and/or movement data of both the unmanned aerial vehicle 100 and of the one or more obstacles may be used to predict a collision (e.g., to predict an impact of one or more obstacles with the unmanned aerial vehicle).

According to various aspects, the one or more processors 102p may include (or may be communicatively coupled with) at least one transceiver configured to provide an uplink transmission and/or downlink reception of radio signals including data, e.g. video or image data and/or commands. The at least one transceiver may include a radio frequency (RF) transmitter and/or a radio frequency (RF) receiver.

The one or more processors 102p may further include (or may be communicatively coupled with) an inertial measurement unit (IMU) and/or a compass unit. The inertial measurement unit may allow, for example, a calibration of the unmanned aerial vehicle 100 regarding a predefined plane in a coordinate system, e.g., to determine the roll and pitch angle of the unmanned aerial vehicle 100 with respect to the gravity vector (e.g. from planet earth). Thus, an orientation of the unmanned aerial vehicle 100 in a coordinate system may be determined. The orientation of the unmanned aerial vehicle 100 may be calibrated using the inertial measurement unit before the unmanned aerial vehicle 100 is operated in flight modus. However, any other suitable function for navigation of the unmanned aerial vehicle 100, e.g., for determining a position, a velocity (also referred to as flight velocity), a direction (also referred to as flight direction), etc., may be implemented in the one or more processors 102p and/or in additional components coupled to the one or more processors 102p. To receive, for example, position information and/or movement data about one or more obstacles, the input of a depth image camera and image processing may be used. Further, to store the respective information in the (e.g., internal) map of the unmanned aerial vehicle 100, as described herein, at least one computing resource may be used.

According to various aspects, the one or more processors 102p of the unmanned aerial vehicle 100 may be configured to implement a control for a cooling system, as described in more detail below.

According to various aspects, as described in more detail below, the unmanned aerial vehicle 100 may include one or more sensors 101 configured to receive ambient condition information associated with an ambient condition in a vicinity of the unmanned aerial vehicle 100; and one or more processors 102p configured to trigger a reduction of an airflow through an air channel of a cooling system of the unmanned aerial vehicle 100 based on the ambient condition information.

Figure 2A:
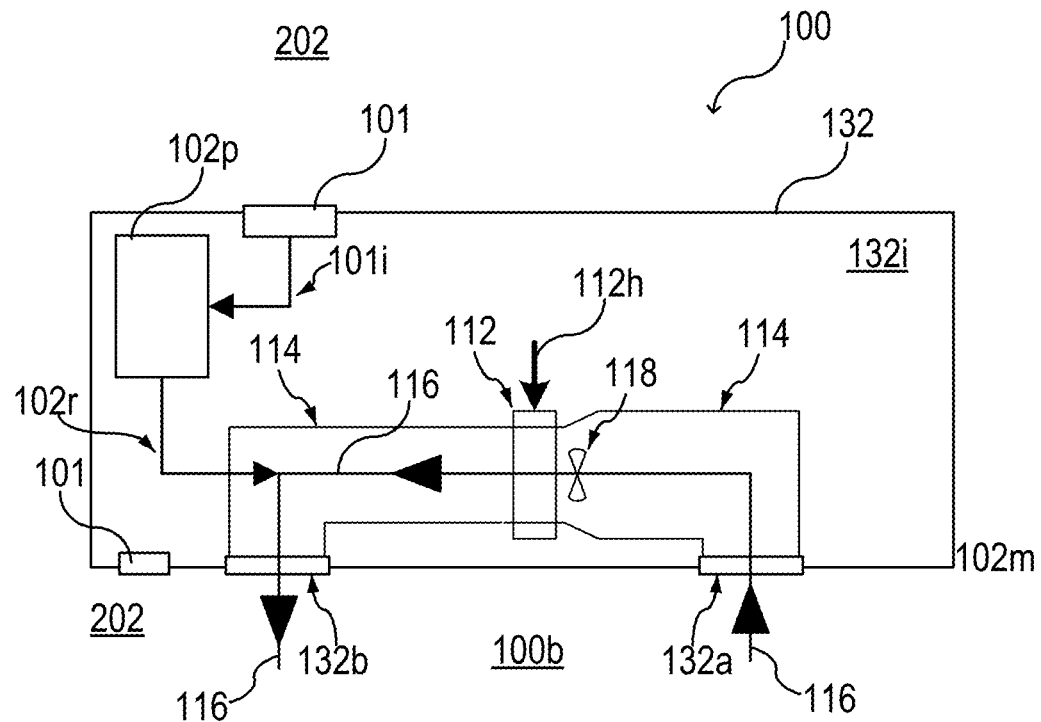
FIG. 2A and FIG. 2B show an unmanned aerial vehicle in a schematic view, according to various aspects.
Figure 2B:
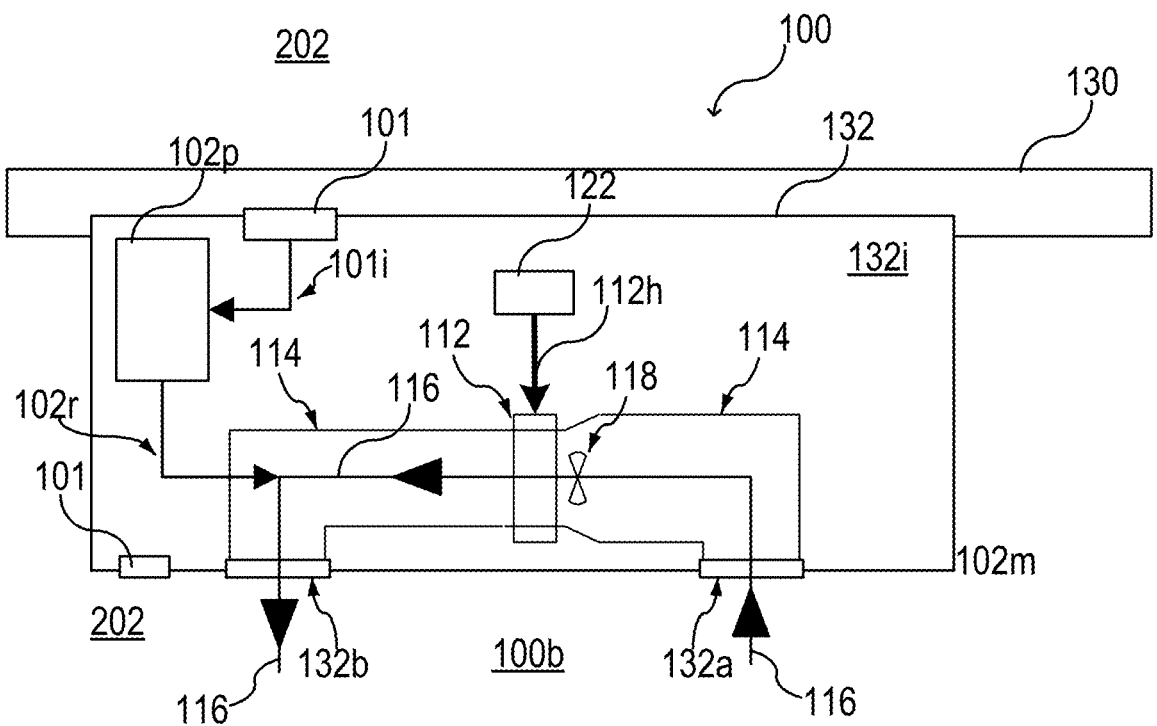

FIG. 2A and FIG. 2B show an unmanned aerial vehicle 100 in a schematic view, according to various aspects. The unmanned aerial vehicle 100 may include a cooling structure 112 configured to dissipate heat 112h. The heat 112h may be generated by one or more electronic devices 122, as illustrated in FIG. 2B.

The unmanned aerial vehicle 100 may further include a shell 132. The shell 132 may be mounted to a support frame 130 of the unmanned aerial vehicle 100, as illustrated in FIG. 2B. The support frame 130 may be used to mount the single components of the unmanned aerial vehicle 100. However, the shell 132 may be configured in any other suitable way and may be connected to any suitable part of the unmanned aerial vehicle 100. The shell 132 may at least partially surround (e.g. encapsulate) the cooling structure 112. Further, the shell 132 may include at least one air inlet 132a and at least one air outlet 132b. According to various aspects, the at least one air inlet 132a and/or the at least one air outlet 132b may be disposed at a bottom side 100b of the unmanned aerial vehicle 100. In other words, during normal flight of the unmanned aerial vehicle 100, the at least one air inlet 132a and/or the at least one air outlet 132b may face the ground. This may allow, for example, preventing falling rain from easily entering the interior 132i of the shell 132.

According to various aspects, an air channel 114 may be disposed inside the shell 132. The air channel 114 may connect the at least one air inlet 132a and at least one air outlet 132b with one another. The air channel 114 and the cooling structure 112 may be part of a cooling system of the unmanned aerial vehicle 100. The cooling system may be configured to dissipate heat from the cooling structure 112 actively via an airflow 116.

According to various aspects, the unmanned aerial vehicle 100 may include at least one fan 118. The at least one fan 118 may be disposed inside the air channel 114. The at least one fan 118 may be configured to provide the airflow 116 through the air channel 114. For example, the air channel 114, the cooling structure 112, and the fan 118 may be part of an active cooling system of the unmanned aerial vehicle 100.

As described herein, the unmanned aerial vehicle 100 may include one or more sensors 101 and one or more processors 102p. In some aspects, the one or more sensors 101 may be configured to receive ambient condition information 101i associated with an ambient condition in a vicinity 202 of the unmanned aerial vehicle 100.

As an example, the one or more sensors 101 may include a moisture or rain sensor to detect moisture or rain in the vicinity 202 of the unmanned aerial vehicle 100. The moisture or rain sensor may be disposed on a top side (opposite the bottom side) of the unmanned aerial vehicle 100. However, to detect, for example, water below the unmanned aerial vehicle 100 a moisture or rain sensor may be disposed on a bottom side of the unmanned aerial vehicle 100. A rain sensor may detect rainfall. According to various aspects, a rain sensor may include an optical measurement system that allows for the detection of rain, e.g. by using infrared light reflection, an optical imaging system (e.g. a camera of the unmanned aerial vehicle 100), etc.

As another example, the one or more sensors 101 may include a particle sensor (e.g. a dust sensor) to detect particles in the vicinity 202 of the unmanned aerial vehicle 100. The particle sensor may be disposed on a bottom side 100b of the unmanned aerial vehicle 100. According to various aspects, a particle sensor may include an optical measurement system that allows for detection and counting of physical particles. The particle sensor may be configured to detect solid particles (also referred to as dust). However, liquid or aerosol particle may also be sensed if desired. Based on the sensed and counted particles, a particle concentration (i.e. a number of particles per volume, e.g. in [particles/m$^3$]) may be determined.

In some aspects, the one or more sensors 101 may be disposed on the same side of the unmanned aerial vehicle 100 as the air inlet 132a, e.g. on the bottom side 100b of the unmanned aerial vehicle 100.

According to various aspects, the one or more processors 102p may be configured to trigger 102r a reduction of the airflow 116 through the air channel 114 based on the ambient condition information 101i.

According to various aspects, the one or more electronic devices 122 may include any type of computing device (e.g. a microchip, a system on a chip, a controller, etc.). As an example, image processing that may be related to one or more optical cameras of the unmanned aerial vehicle 100 may benefit from a high performance computing device, which usually consumes significant power and therefore generates more heat 112h that must be dissipated by the cooling system of the unmanned aerial vehicle 100.

In some aspects, an active cooling system, as described herein, may allow for utilization of one or more computing devices having a comparatively high performance. However, in the case that the active cooling system is switched off, e.g. during rain or due to a dusty environment, the one or more computing devices may not be able to run on full load without overheating. Even if the one or more computing devices would have a thermal management, the loss of computing performance may usually affect all of the computing functions in a similar way. According to various aspects, one or more computing functions may be therefore reduced or disabled in a controlled manner such that other desired computing functions may be maintained without or with a lower performance loss.

Figure 2C:
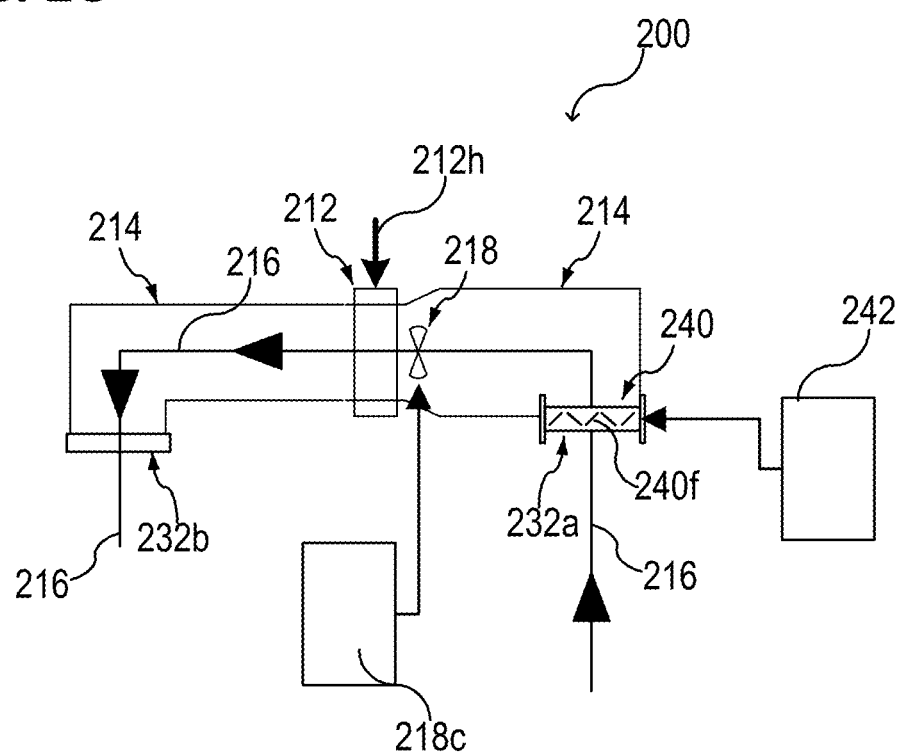
FIG. 2C shows an active cooling system in a schematic view, according to various aspects.

FIG. 2C exemplarily shows an active cooling system 200, e.g. the active cooling system of the unmanned aerial vehicle 100, according to various aspects. The active cooling system 200 may include a cooling structure 212 to dissipate heat 212h and an air channel 214 to cool the cooling structure 212 via an airflow 216. The airflow may be provided from an air inlet 232a to an air outlet 232b via at least one fan 218 or any other suitable structure.

In one aspect, the airflow 216 may be generated and controlled by controlling the at least one fan 218. According to various aspects, a fan controller 218c may be configured to control a rational speed of the at least one fan 218. Exemplarily, a first pre-defined rotational speed (e.g. in the range from about 500 rpm to about 3000 rpm) of the fan 218 may be associated with a first operation mode in which the heat 212h is dissipated via a substantial airflow 216. Further, a second pre-defined rotational speed (e.g. in the range from about 0 rpm to about 100 rpm) of the fan 218 may be associated with a second operation mode in which no substantial airflow is provided, e.g. to prevent water or dust from entering the air channel 214.

In another aspect, the airflow 216 may be generated via the at least one fan 218 and controlled via a flap structure 240. The flap structure 240 may include at least one positionable flap 240f configured to be positioned at least in a first position and a second position to control the airflow 216. In other words, the unmanned aerial vehicle 100 may include a flap structure 240 to control the airflow 216 through the air channel 214 by positioning of at least one flap 240f of the flap structure 240. According to various aspects, a flap controller 242 may be configured to position the at least one flap 240f based on the ambient condition information. As an example, the at least one positionable flap 240f may not substantially cover the air inlet 232a in a first position to allow the airflow 216 to be generated via the at least one fan 218 and may substantially cover the air inlet 232a when the positionable flap 240f is in a second position to reduce or suppress the airflow 216.

For example, the at least one fan 218 may run with a pre-defined rotational speed (e.g. in the range from about 500 rpm to about 3000 rpm) in a first operation mode in which the heat 212h is dissipated via a substantial airflow 216. In the first operation mode, the flap structure 240 is controlled in such a way that the airflow 216 is not substantially influenced (in other words, the flap structure is open to allow the substantial airflow 216 to be generated). Further, the at least one fan 218 may run with the same pre-defined rotational speed in a second operation mode. In the second operation mode, the flap structure 240 is controlled in such a way that the airflow 216 is substantially reduced or suppressed (in other words, the flap structure may be closed to prevent the airflow 216 from being generated). In other words, no substantial airflow is provided in the second operation mode despite the at least one fan 218 rotating with the pre-defined rotational speed, e.g. to prevent water or dust from entering the air channel 214.

According to various aspects, an active cooling system 200 may include: a cooling structure 212 configured to dissipate heat 212h (e.g. from at least one electronic device); an air channel 214 configured to dissipate heat from the cooling structure 212 via an airflow 216; at least one fan 218 configured to provide the airflow 216 through the air channel 214; a fan controller 218c configured to control a rotational speed of the at least one fan 218 based on an ambient condition information. According to various aspects, an unmanned aerial vehicle 100 may include the active cooling system 200. In this case, the control of the rotational speed of the at least one fan 218 may be based on flight operation information instead of the ambient condition information.

According to various aspects, an unmanned aerial vehicle 100 may include: a cooling structure 212 configured to dissipate heat 212h (e.g. from at least one electronic device of the unmanned aerial vehicle 100); an air channel 214 configured to dissipate heat from the cooling structure 212 via an airflow 216; at least one fan 218 configured to provide the airflow 216 through the air channel 214; a flap structure 240 configured to control the airflow 216 through the air channel 214 by positioning of at least one flap 240f of the flap structure 240; and a flap controller 242 configured to position the at least one flap 240f based on an ambient condition information and/or flight operation information.

Figure 3A:
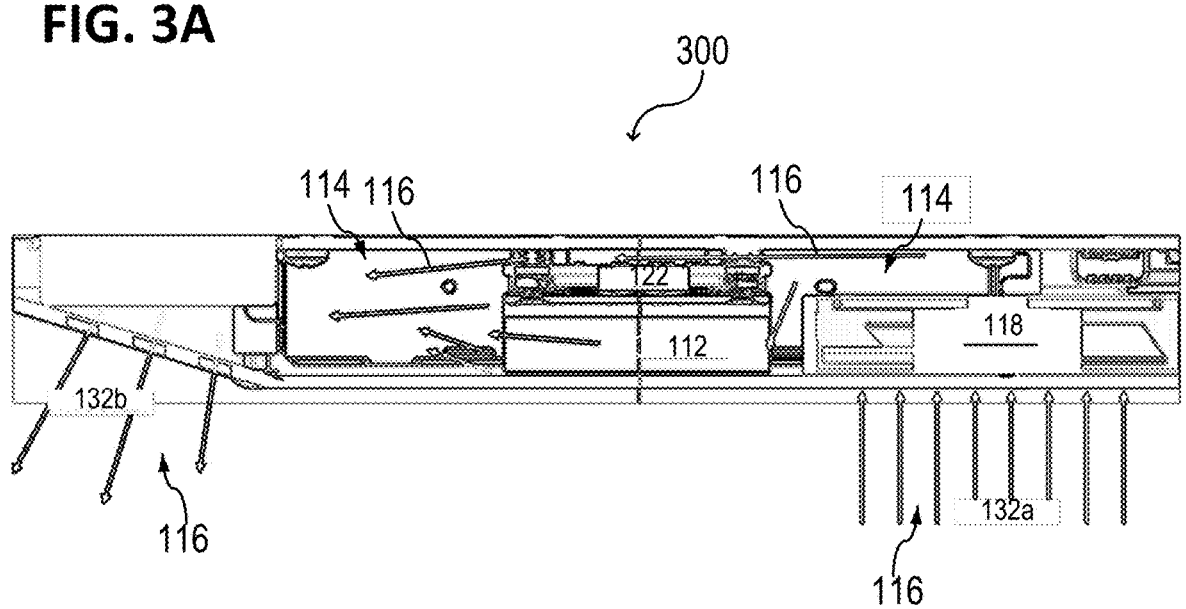
FIG. 3A shows a computing unit assembly in a schematic view, according to various aspects.

FIG. 3A illustrates a computing unit assembly 300 of an unmanned aerial vehicle 100 in a schematic view, according to various aspects. It may be desired that the air inlet 132a of the system may be directed downwards in a suitable position and close to the ground. Adding dust and water protective sheets may limit the useful airflow and may clog during operation. In some aspects, the one or more electronic devices 122 (e.g. a central processing unit, CPU) may not be responsible for substantial flight associated tasks, i.e. for the flight control. The flight control function may be carried out by additional one or more processors, e.g. by a flight controller. The one or more electronic devices 122 may be used, for example, to control an imaging system of the unmanned aerial vehicle 100, a collision detection and avoidance system of the unmanned aerial vehicle 100, and/or any other system providing additional functions to the unmanned aerial vehicle 100.

Figure 3B:
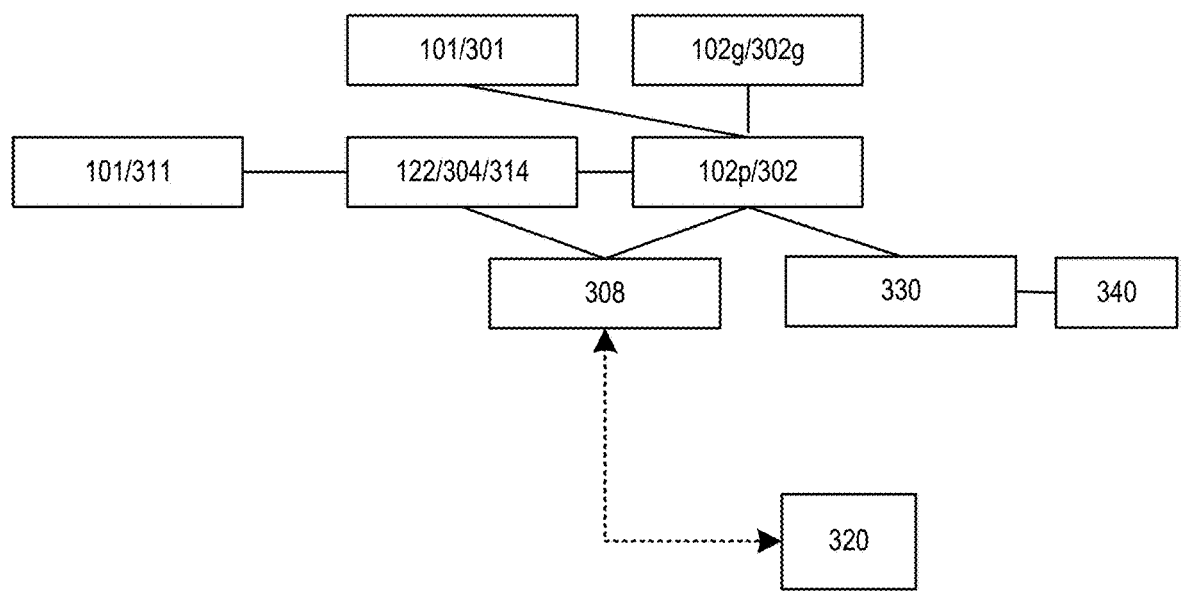
FIG. 3B shows a block diagram of various components associated with an unmanned aerial vehicle, according to various aspects.

FIG. 3B illustrates several components of an unmanned aerial vehicle 100 in a schematic block diagram, according to various aspects. The unmanned aerial vehicle 100 may include a flight controller 302. The flight controller 302 may be configured to provide one or more control signals to a motor controller 330 of the unmanned aerial vehicle 100, wherein the motor controller 330 may control one or more electric motors 340 of the unmanned aerial vehicle 100.

According to various aspects, the one or more electronic devices 122 of the unmanned aerial vehicle 100 may include an image processor (or any other suitable compute unit) 304 associated with an imaging device 311 of the unmanned aerial vehicle 100. In some aspects, the unmanned aerial vehicle 100 may include may include an image processor 304 and an imaging device 311 that are part of an imaging system. In some aspects, the imaging device 311 may include one or more cameras.

Image data may be transmitted via a wireless link 308 to any desired external device 320, e.g. to a remote control, to a virtual or augmented reality device, etc. The wireless link 308 may be also used to transmit and receive flight control data or other control signals from the unmanned aerial vehicle 100 to the external device (e.g. to the remote control) 320 or from the external device (e.g. from the remote control) 320 to the unmanned aerial vehicle 100.

According to various aspects, the wireless link 308 may include one or more receivers configured to receive a signal representing the ambient condition information to control the airflow 116 through the air channel 114. The signal representing the ambient condition information may be provided by a remote control 320 associated with the unmanned aerial vehicle 100. Alternatively, a signal representing the ambient condition may be provided by the flight controller 302.

As an example, a moisture sensor, a dust sensor, etc. 301 may be communicatively coupled to the flight controller 302 and the flight controller 302 may be configured to trigger the reduction of the airflow 116 as described herein based on sensor data received from the moisture sensor, a dust sensor, etc. 301.

As another example, the unmanned aerial vehicle 100 may include a positioning system 302g (also referred to as position detection system) that may be communicatively coupled to the flight controller 302, and the flight controller 302 may be configured to trigger the reduction of the airflow 116 as described herein based on position data received from the positioning system 302g.

According to various aspects, one or more cameras of the unmanned aerial vehicle 100 may provide image data to at least one image processor 304 of the unmanned aerial vehicle 100. When the airflow 116 (and therefore the cooling rate of the at least one image processor 304) is reduced, a frame rate associated with the imaging system (e.g. associated with the one or more cameras and/or the image processor 304) may be reduced. Alternatively, the imaging system (e.g. the image processor 304) may be disabled. This may avoid triggering overheat protection functions of the at least one image processor 304.

According to various aspects, the flight controller 302 may be spaced apart from the at least one electronic device 122 (e.g. from the image processor 304). The flight controller 302 may not be directly connected to the cooling structure 112 that is used to actively cool the at least one electronic device 122 (e.g. the image processor 304).

The one or more electronic devices 122 may be or may include one or more processors 314 associated with a collision detection and avoidance system. In some aspects, the one or more cameras that may be part of the imaging system may be used to receive obstacle information associated with one or more obstacles in the vicinity of the unmanned aerial vehicle 100. However, alternatively or additionally one or more other sensors (e.g. radar sensors, ultrasonic sensors, light sensors, etc.) may be used to receive the obstacle information. When the airflow 116 (and therefore the cooling rate of the one or more processors 314 associated with the collision detection and avoidance system) is reduced, a dimension of a detection zone associated with the collision detection and avoidance system is reduced or the collision detection and avoidance system may be disabled. This may avoid triggering overheat protection functions of the one or more processors 314 associated with the collision detection and avoidance system.

According to various aspects, the imaging system of the unmanned aerial vehicle 100 may be configured to provide a preview image of the one or more cameras to the user (also referred to as pilot) of the unmanned aerial vehicle 100, e.g. via the remote control 320 or a remotely connected display, etc. When the airflow 116 is reduced, the frame rate of the preview image may be reduced.

In some aspects, reducing or limiting the frame rate of the preview image and or reducing a dimension of a detection zone associated with the collision detection and avoidance system may lower the thermal load on the at least one electronic device 122 (e.g. one a CPU) thus allowing the fan 118 to be turned off or rotate slowly (e.g. with less than 100 rpm) while the unmanned aerial vehicle 100 is operated in dusty or rainy conditions (i.e. near ground or in rainy weather). As an example, the fan 118 may be turned off in response to detecting rain (e.g. with a surface mounted moisture sensor), to improve the waterproofness of the system.

According to some aspects, the at least one electronic device 122 of the unmanned aerial vehicle 100 may include a central processing unit (CPU) that may get position (and optional moisture, dust, etc.) information from the flight controller 302 and based on that it may be decided when to activate a dust/water ingression protection mode. The dust/water ingression protection mode may be activated during lift-off and landing and/or after rain is detected.

According to various aspects, the cooling structure 112 of the unmanned aerial vehicle 100 may include a reservoir and at least one phase change material disposed in the reservoir. This may allow, for example, to latently store heat that is dissipated from the at least one electronic device. As an example, when the airflow 116 is reduced, the storage of latent heat may allow efficient avoidance of overheating of the at least one electronic device 122 despite the fan 118 may be switched off. The cooling structure may include a heatsink (e.g. a metal, e.g. copper or aluminum, body including the reservoir) and a cooler connected with one another via one or more heat pipes (e.g. via one or more copper heat pipes).

For example, a mobile (e.g. low power and small die-area) processor may be used in unmanned aerial vehicle applications to increase, for example, battery life and reduce weight. The thermal envelope of a processor (e.g. of a mobile processor) may be limited due to the small die-area that may lead to challenges in thermal conductivity and thus power dissipation. A small thermal envelope of a processor may lead to a situation where dramatic changes in cooling may not be accurately measured since the processor may rely on thermal throttling and may operate already at maximum temperature in high load cases. In the case of a hardware fault of the cooling unit, e.g. due to a fan damage or a clogging, a warning system may be implemented to ensure a controlled shutdown or limitation of power functions. As an example, the obstacle detection and avoidance may be disabled. Such a warning system may be implemented as measurement of ambient temperature conditions while simultaneously measuring heatsink temperature. A dramatic fan motor failure may result in an immediate increase in heatsink temperature comparing to known load and ambient temperature conditions.

According to various aspects, an active cooling structure may be provided that includes a fail-safe protection to prevent overheating damages to an electronic device to be cooled due to a damaged or switched of fan. This fail-safe protection may be implemented into the unmanned aerial vehicle 100 as described herein to compensate for the loss of cooling capacity due to the reduction of the airflow 116. According to various aspects, the fail-safe protection may include a phase change material.

Phase change materials (PCMs) are substances with a comparably high enthalpy of fusion and may be classified as latent heat storing (LHS) units. Basically, when the temperature reaches the melting point (or freezing point) of the specific PCM, a phase transition occurs at constant temperature.

Figure 4A:
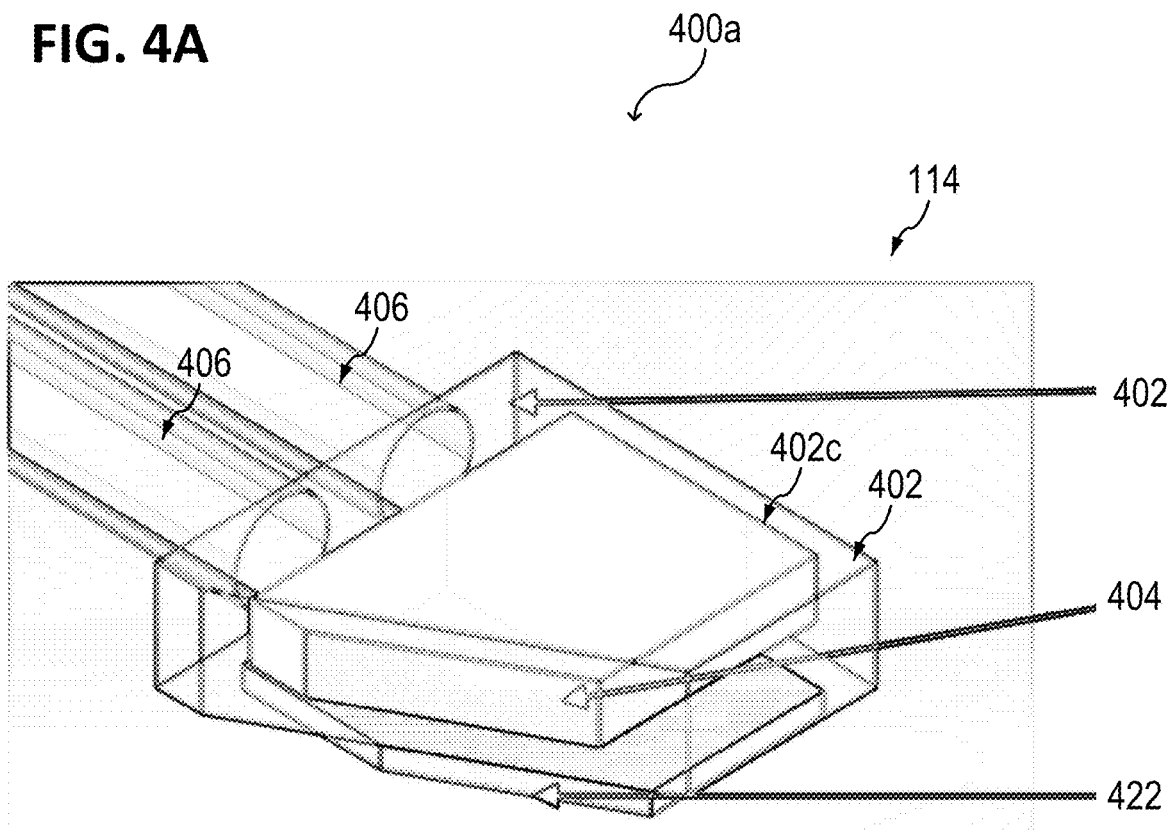
FIG. 4A shows a cooling structure in a schematic view, according to various aspects.

FIG. 4A shows a cooling structure 400a in a schematic view, according to various aspects. The cooling structure 400a may be used to cool the at least one electronic device 122 of the unmanned aerial vehicle 100. However, the cooling structure 400a may be used to cool any suitable device in any suitable environment.

According to various aspects, the cooling structure 400a may include a heatsink 402. An LHS unit 404 may be integrated into the heatsink 402. The heatsink 402 may be cooled via one or more heat pipes 406. The heatsink 402 may include a cavity 402c. The LHS unit 404 (the phase change material) may be disposed in the cavity 402c of the heatsink 402.

According to various aspects, the time between a thermal shutdown of a device to be cooled 422 and the actual failure or the switch off of the cooling system may be increased due to such a design. In some aspects, this cooling mechanism may be implemented into the unmanned aerial vehicle 100 to eliminate the need for power scaling during lift-off and other cases when the airflow 116 for cooling the cooling structure 112 is reduce, e.g. when the fan 118 is switched off.

At least one LHS unit 404 integrated into the cooling structure 116 may provide a way to dissipate heat as stored latent heat without affecting the performance of the device to be cooled 422. The heatsink 402 with the integrated LHS unit 404 may be attached to the device to be cooled 422. As an example, when the airflow 116 is increased again (e.g. when the fan 118 is switched on again), the cooled heatsink may provide sufficient thermal transfer to cool the at least one electronic device 122 and (at the same time) to dissipate the latent heat of LHS unit 404. Considering the thermal profile of the device to be cooled 422 (e.g. of the at least one electronic device 122) and the characteristics of the LHS unit 404 may allow to provide an advance active cooling system.

According to various aspects, there may be a situation in which it is desired to avoid an active cooling (e.g. to avoid using at least one fan). In some aspects, such a situation may occur due to environmental conditions, e.g. due to a high humidity and dust particles in the environment of the active cooling system. Relying only on a passive cooling system may not be desired when the system to be cooled includes a computing device of relatively high operating power. In general, switching of an active cooling system may lead to a disturbed workflow, temporarily disabled functionalities, and/or a decrease in overall performance of the system to be cooled.

According to some aspects, a phase change material (PCM) may be used to support an active cooling system in situations where the airflow is suppressed or reduced, as described above. In another aspect, a passive cooling system may be provided include a phase change material to increase temporarily the cooling capacity.

Figure 4B:
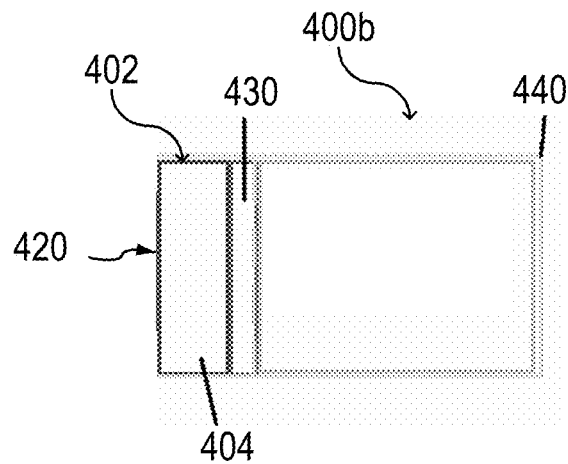
FIG. 4B shows a battery assembly in a schematic view, according to various aspects.
Figure 4B:
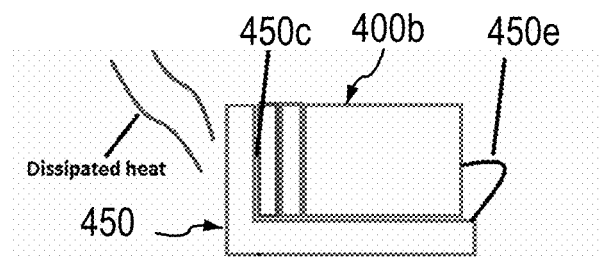

FIG. 4B illustrates a battery assembly 400b and a battery charger 450 associated with the battery assembly 400b in a schematic view, according to various aspects. In some aspects, the battery assembly 400b may include a phase change material 404 containing heatsink 402 and at least one battery structure 440. The battery structure 440 may include one or more battery cells and, e.g. optionally, battery cell related electronics. The battery assembly 400b may be used as power supply in a robotic system, e.g. in an unmanned aerial vehicle. When the battery assembly 400b and is inserted into the associated system, a proper thermal contact 420 may be provided connecting the heatsink 402 with a hot spot of the system (e.g. with a SoC (system on a chip) or a heat-pipe, etc.). Therefore, the phase change material 404 containing heatsink 402 may be used to cool the associated system. As an example, the phase change material 404 containing heatsink 402 may be used to cool the at least one electronic device 122 of the unmanned aerial vehicle 100, e.g. instead of the active cooling system. The phase change material 404 containing heatsink 402 may be thermally isolated via a thermal insulator 430 from the battery structure.

According to various aspects, phase change material 404 may absorb thermal energy as latent heat, thereby keeping the system at a controlled temperature. The cooling process time of the phase change material 404 may be decreased by using an active cooling system integrated into the corresponding battery charger 450. A proper thermal contact 450c may be provided between the active cooling system of the battery charger 450 and the phase change material 404 containing heatsink 402 when the battery assembly 400b is charged via the battery charger 450. As an example, the battery charger 450 may be electrically connected 450e to the respective terminals of the battery assembly 400b to charge the battery cells of the battery assembly 400b accordingly. The active cooling system of the battery charger 450 may include one or more peltier elements or any other suitable electro-thermal transducer.

This type of cooling system may provide a possibility to create water and dust proof thermal solutions for harsh environments and relatively high compute power applications. An SoC with much more vast thermal envelope may be integrated into the system. As an example, PCM 404 without stored latent heat may be introduced with the charged battery as into the respective system to be supplied with electric power.

Phase change materials (PCMs) 404 include substances with a high enthalpy of fusion and can be classified as latent heat storing (LHS) units. Basically, when the temperature reaches the melting point (or freezing point) a phase transition occurs but the temperature remains constant. When the enthalpy of fusion is referenced to a unit of mass it can be called specific heat of fusion.

A hermetic and metallic heatsink with internal cavities filled with PCM may provide a robust and reliable way to cool a system without a need of a large surface or contacts with cooling medium, such as air. When used as LHS this type of heatsink provides a way to cool a relatively high power device without excessive heatsink fins, which are in some cases impossible to be integrated to the system due the harsh (dust and moisture) environments in which they are used. For example, the phase change material may have a melting point around 70° C. and an enthalpy of fusion over 200 kJ/kg. In this case, 45 grams of this phase change material would be sufficient to cool a 5 W SoC for about 30 minutes. According to various aspects, the phase change material may have a melting point in the range from about 30° C. to about 150° C., e.g. in the range from about 50° to about 120° C. In some aspects, the melting temperature may be below a critical temperature of the device to be cooled.

According to various aspects, the phase change material 404 containing heatsink 402 may be integrated into the battery housing in such way that when the battery is inserted to the device sufficient thermal contact with the electronic device to be cooled (e.g. with an SoC, an storage device, a heat pipe, etc.) is formed. The battery cells may be thermally insulated from the heatsink 402. During operation, the heat generated by the device may be absorbed as latent heat into the phase change material 404 of the heatsink 402.

Exemplarily, when the battery runs out of electric charge and the user replaces the battery with a charged one. The PCM located in the charged battery may not have absorbed latent heat and thus the device remains cool and the operation can be performed with minimum distraction. For example, when an inspection is performed with unmanned aerial vehicle 100 or another device, the battery may be changed several times during multiple hours. The empty battery with stored latent heat may be placed into charger. The charger may form sufficient thermal contact with the PCM containing heatsink—the heatsink may be cool when the battery is full of electrical charge.

Figure 5:
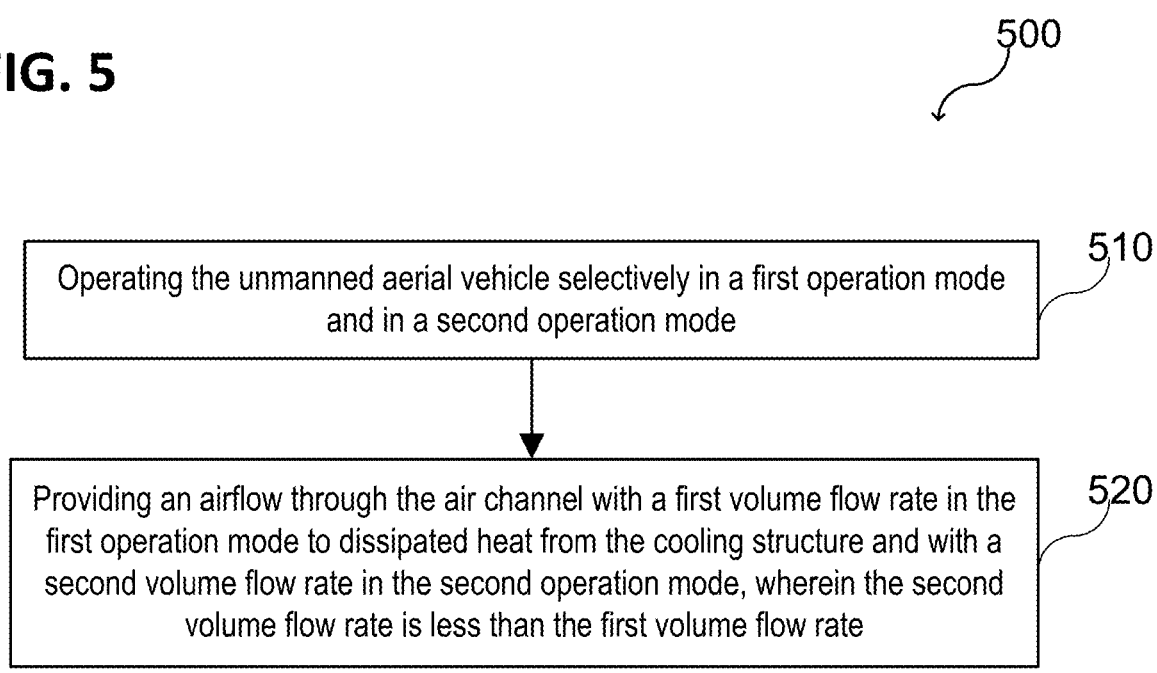
FIG. 5 shows a schematic flow diagram of a method for operating an unmanned aerial vehicle, according to some aspects.

FIG. 5 shows a schematic flow diagram of a method 500 for operating an unmanned aerial vehicle. The unmanned aerial vehicle may include a cooling structure configured to dissipate heat; a shell at least partially surrounding the cooling structure, the shell including at least one air inlet and at least one air outlet; an air channel connecting the at least one air inlet and at least one air outlet with one another, wherein at least a portion of the cooling structure is disposed inside the air channel. According to various aspects, the method 500 for operating an unmanned aerial vehicle may include: in 510, operating the unmanned aerial vehicle selectively in a first operation mode and in a second operation mode; and, in 520, providing an airflow through the air channel with a first volume flow rate in the first operation mode to dissipated heat from the cooling structure and with a second volume flow rate in the second operation mode, wherein the second volume flow rate is less than the first volume flow rate.

Figure 6:
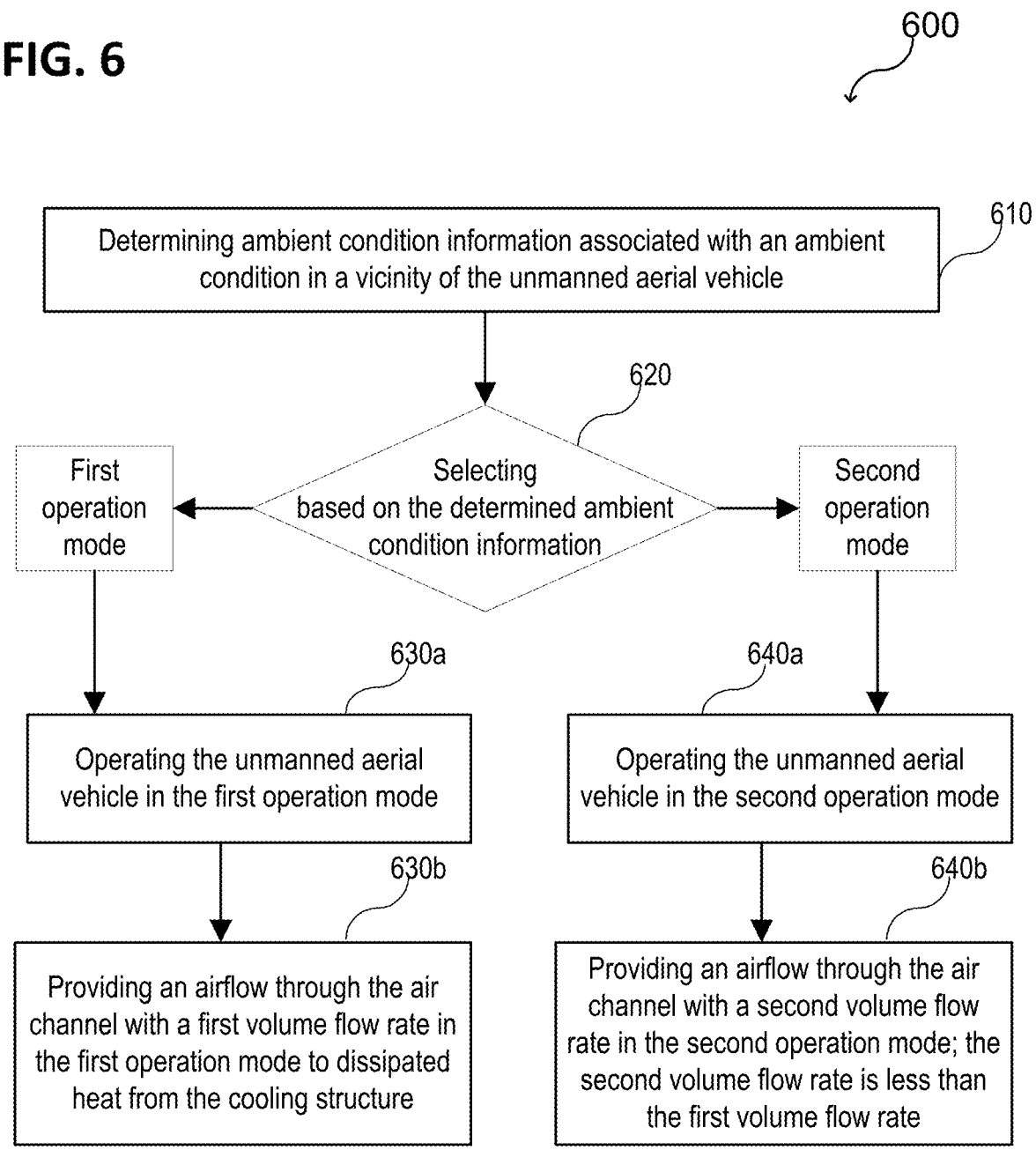
FIG. 6 shows a schematic flow diagram of a method for operating an unmanned aerial vehicle, according to some aspects.

FIG. 6 shows a schematic flow diagram of a method 600 for operating an unmanned aerial vehicle. The unmanned aerial vehicle may include a cooling structure configured to dissipate heat; a shell at least partially surrounding the cooling structure, the shell including at least one air inlet and at least one air outlet; an air channel connecting the at least one air inlet and at least one air outlet with one another, wherein at least a portion of the cooling structure is disposed inside the air channel. According to various aspects, the method 600 for operating an unmanned aerial vehicle may include: in 610, determining ambient condition information associated with an ambient condition in a vicinity of the unmanned aerial vehicle; in 620, selecting a first operation mode or a second operation mode based on the determined ambient condition information; in 630a, 630b, operating the unmanned aerial vehicle in the first operation mode when then first operation mode is selected, wherein in the first operation mode an airflow is provided through the air channel, wherein the airflow provided through the air channel in the first operation mode has a first volume flow rate to dissipated heat from the cooling structure; and, in 640a, 640b, operating the unmanned aerial vehicle in the second operation mode when then second operation mode is selected, wherein in the second operation mode an airflow is provided through the air channel, wherein the airflow provided through the air channel in the second operation mode has a second volume flow rate less than the first volume flow rate.

In some aspects, the second volume flow rate may be less than 10% of the first volume flow rate. In some aspects, the second volume flow rate may be less than 1% of the first volume flow rate. In some aspects, the second volume flow rate may be substantially zero; as an example, the fan 118 of the active cooling system 200 of the unmanned aerial vehicle 100 may be switched off in this case and/or the at least one air inlet 132a may be completely covered by a flap structure 240.

As an example, a main task of a payload processing CPU of an unmanned aerial vehicle 100 may be to parse the preview image data from at least one main camera and to read and process depth data from one or more depth camera modules. In some aspects, the frame rate during takeoff and landing may be decreased. In some aspects, one or more functions may be disabled for a short time, e.g. for a time duration in the range from about 1 s to about 30 s. This may reduce the need for an active cooling of the system, i.e. the fan can be turned off or kept at very low rotational speed. Since the unmanned aerial vehicle 100 may keep track of its position, it may be able to determine when the landing will occur and may perform similar performance downscaling and turn down the fan.

According to various aspects, these protective measures may not be needed in one or more situations, i.e. in a situation where the unmanned aerial vehicle 100 is not started and/or landed over a dusty surface, the protective measures may be disabled by the user.

In the following, various examples are provided with reference to the aspects described herein.

Example 1 is an unmanned aerial vehicle, including: a cooling structure configured to dissipate heat; a shell at least partially surrounding the cooling structure, the shell including at least one air inlet and at least one air outlet; an air channel connecting the at least one air inlet and at least one air outlet with one another and configured to dissipate heat from the cooling structure via an airflow; at least one fan configured to provide the airflow through the air channel; one or more sensors configured to receive ambient condition information associated with an ambient condition in a vicinity of the unmanned aerial vehicle; and one or more processors configured to trigger a reduction of the airflow through the air channel based on the ambient condition information.

Example 2 is an unmanned aerial vehicle, including: a cooling structure configured to dissipate heat; an air channel configured to dissipate heat from the cooling structure via an airflow; at least one fan configured to provide the airflow through the air channel; one or more sensors configured to receive ambient condition information associated with an ambient condition in a vicinity of the unmanned aerial vehicle; and one or more processors configured to trigger a reduction of the airflow through the air channel based on the ambient condition information.

Example 3 is an unmanned aerial vehicle, including: a cooling structure configured to dissipate heat; an air channel configured to dissipate heat from the cooling structure via an airflow; at least one fan configured to provide the airflow through the air channel; and one or more processors configured to receive ambient condition information and/or flight operation information and to trigger a reduction of the airflow through the air channel based on the ambient condition information and/or the flight operation information.

In Example 4, the unmanned aerial vehicle of Example 2 or 3 may optionally include: a shell at least partially surrounding the cooling structure, the shell including at least one air inlet and at least one air outlet and the air channel connecting the at least one air inlet and at least one air outlet with one another to dissipate heat from the cooling structure via an airflow from the at least one air inlet to the at least one air outlet.

Example 5 is an active cooling system, including: a cooling structure configured to dissipate heat; an air channel configured to dissipate heat from the cooling structure via an airflow; at least one fan configured to provide the through the air channel; a fan controller configured to control a rotational speed of the at least one fan based on an ambient condition information.

Example 6 is an unmanned aerial vehicle including the active cooling system of Example 5.

Example 7 is an unmanned aerial vehicle may include: a cooling structure configured to dissipate heat; an air channel configured to dissipate heat from the cooling structure via an airflow; at least one fan configured to provide the airflow through the air channel; a flap structure configured to control the airflow through the air channel by positioning of at least one flap of the flap structure; and a flap controller configured to position the at least one flap based on an ambient condition information and/or flight operation information.

Example 8 is a cooling structure, including: a heatsink having at least one cavity, at least one phase change material disposed in the at least one cavity of the heatsink.

Example 9 is a battery assembly, including the cooling structure of Example 8.

Example 10 is an unmanned aerial vehicle including the cooling structure of Example 8 or the battery assembly of Example 9.

Example 11 is an unmanned aerial vehicle, including: a cooling structure configured to dissipate heat; an air channel configured to dissipate heat from the cooling structure via an airflow; at least one fan configured to provide the airflow through the air channel; one or more sensors configured to receive ambient condition information associated with an ambient condition in a vicinity of the unmanned aerial vehicle; and one or more processors configured to trigger a reduction of the airflow through the air channel based on the ambient condition information.

In Example 12, the unmanned aerial vehicle of Example 11 may optionally include: at least one electronic device, wherein the cooling structure is configured to dissipate the heat from the at least one electronic device.

In Example 13, the unmanned aerial vehicle of Example 11 or 12 may optionally include: a shell at least partially surrounding the cooling structure, the shell including at least one air inlet and at least one air outlet and the air channel connecting the at least one air inlet and at least one air outlet with one another to dissipate heat from the cooling structure via an airflow from the at least one air inlet to the at least one air outlet.

In Example 14, the unmanned aerial vehicle of Example 12 or 13 may optionally include that the at least one electronic device includes a central processing unit.

In Example 15, the unmanned aerial vehicle of any one of Examples 12 to 14 may optionally include that the one or more processors are further configured to at least reduce a computing load associated with at least one computing function of the at least one electronic device based on the ambient condition information.

In Example 16, the unmanned aerial vehicle of Example 5 may optionally include that the one or more processors are configured to shut down the at least one computing function.

In Example 17, the unmanned aerial vehicle of any one of Examples 12 to 14 may optionally include that the reduction of the airflow is triggered, the one or more processors are configured to maintain a first computing load associated with a first pre-defined computing function of the at least one electronic device unreduced and to at least reduce a second computing load associated with a second pre-defined computing function of the at least one electronic device.

In Example 18, the unmanned aerial vehicle of any one of Examples 11 to 17 may optionally include: an imaging system, wherein the at least one electronic device includes at least one image processor associated with the imaging system.

In Example 19, the unmanned aerial vehicle of Example 18 may optionally include that the imaging system includes one or more cameras connected to the at least one image processor to provide image data to the at least one image processor.

In Example 20, the unmanned aerial vehicle of Example 18 or 19 may optionally include that the one or more processors are configured to at least reduce a frame rate associated with the imaging system or disabling the imaging system when a reduction of the airflow is triggered.

In Example 21, the unmanned aerial vehicle of any one of Examples 11 to 20 may optionally include: a collision detection and avoidance system, wherein the at least one electronic device is part of the collision detection and avoidance system.

In Example 22, the unmanned aerial vehicle of Example 21 may optionally include that the one or more processors are configured to at least reduce a dimension of a detection zone associated with the collision detection and avoidance system when a reduction of the airflow is triggered.

In Example 23, the unmanned aerial vehicle of Example 21 may optionally include that the one or more processors are configured to disable the collision detection and avoidance system when a reduction of the airflow is triggered.

In Example 24, the unmanned aerial vehicle of any one of Examples 11 to 23 may optionally include that the one or more sensors includes at least one receiver configured to receive a signal representing the ambient condition information.

In Example 25, the unmanned aerial vehicle of Example 24 may optionally include that the signal representing the ambient condition information is provided by a flight controller of the unmanned aerial vehicle or by a remote control associated with the unmanned aerial vehicle.

In Example 26, the unmanned aerial vehicle of any one of Examples 11 to 25 may optionally include that the ambient condition information includes dust information representing a dust pollution in the vicinity of the unmanned aerial vehicle.

In Example 27, the unmanned aerial vehicle of any one of Examples 11 to 26 may optionally include that the ambient condition information comprise weather information representing rain in the vicinity of the unmanned aerial vehicle.

In Example 28, the unmanned aerial vehicle of any one of Examples 11 to 27 may optionally include that the one or more processors are configured to trigger at least a reduction of a rotational speed of the fan to at least reduce the airflow.

In Example 29, the unmanned aerial vehicle of any one of Examples 11 to 28 may optionally include that the one or more sensors includes at least one rain sensor configured to detect rain in the vicinity of the unmanned aerial vehicle, wherein the one or more processors are configured to trigger the reduction of the airflow when rain is detected.

In Example 30, the unmanned aerial vehicle of any one of Examples 11 to 29 may optionally include that the one or more sensors includes at least one particle sensor configured to detect a particle concentration of solid particles and/or liquid particles in the vicinity of the unmanned aerial vehicle, wherein the one or more processors are configured to trigger the reduction of the airflow when the detected particle concentration in the vicinity of the unmanned aerial vehicle is equal to or greater than a predefined particle concentration threshold.

In Example 31, the unmanned aerial vehicle of any one of Examples 11 to 30 may optionally include: a flap structure to control the airflow.

In Example 32, the unmanned aerial vehicle of any one of Examples 11 to 31 may optionally include that the cooling structure includes a reservoir and at least one phase change material disposed in the reservoir.

In Example 33, the unmanned aerial vehicle of Example 32 may optionally include that the cooling structure includes a heatsink and a cooler connected with one another via one or more heat pipes, wherein the reservoir is disposed in the heatsink.

Example 34 is an unmanned aerial vehicle, including: a cooling structure configured to dissipate heat; an air channel configured to dissipate heat from the cooling structure via an airflow; at least one fan configured to provide the airflow through the air channel; one or more processors configured to receive a trigger signal and to trigger a reduction of the airflow based on the received trigger signal.

In Example 35, the unmanned aerial vehicle of Example 34 may optionally include: a flight controller to control flight of the unmanned aerial, wherein the flight controller is configured to generate the trigger signal.

In Example 36, the unmanned aerial vehicle of Example 35 may optionally include that the flight controller is configured to select between at least one first flight operation mode and at least one second flight operation mode and to generate the trigger signal to trigger a reduction of the airflow when the at least one second flight operation mode is selected.

In Example 37, the unmanned aerial vehicle of Example 36 may optionally include that the at least one second flight operation mode includes a lift-off operation mode and/or a landing operation mode.

In Example 38, the unmanned aerial vehicle of Example 36 may optionally include that the at least one second flight operation mode includes a rain operation mode or a dusty environment operation mode.

In Example 39, the unmanned aerial vehicle of Example 34 may optionally include: a remote controller associated with the unmanned aerial vehicle and configured to generate the trigger signal.

Example 40 is an unmanned aerial vehicle, including: a cooling structure configured to dissipate heat; an air channel configured to dissipate heat from the cooling structure via an airflow; at least one fan configured to provide the airflow through the air channel; a flap structure configured to control the airflow through the air channel by positioning of at least one flap of the flap structure; one or more sensors configured to receive ambient condition information associated with an ambient condition in a vicinity of the unmanned aerial vehicle; and a flap controller configured to position the at least one flap based on the ambient condition information.

In Example 41, the unmanned aerial vehicle of Example 40 may optionally include that the one or more sensors include at least one rain sensor configured to detect rain in the vicinity of the unmanned aerial vehicle, and that the flap controller triggers a movement of the at least one positionable flap from an open position to a closed position to at least reduce the airflow when rain is detected.

In Example 42, the unmanned aerial vehicle of Example 40 may optionally include that the one or more sensors include at least one particle sensor configured to detect a particle concentration of solid and/or liquid in the air, and that the flap controller triggers a movement of the at least one positionable flap from an open position to a closed position to at least reduce the airflow when the detected particle concentration is equal to or greater than a predefined particle concentration threshold.

Example 43 is a method for operating an unmanned aerial vehicle, the method including: switching between a first operation mode and a second operation mode; the first operation mode including cooling a cooling structure disposed inside an air channel via an airflow having a first volume flow rate, the cooling structure dissipating heat from at least one electronic device of the unmanned aerial vehicle; the second operation mode including providing an airflow through the air channel with a second volume flow rate, wherein the first volume flow rate is greater than the second volume flow rate.

In Example 44, the method of Example 43 may optionally include that the second volume flow rate is substantially zero.

In Example 45, the method of Example 43 or 44 may optionally include: determining ambient condition information associated with an ambient condition in a vicinity of the unmanned aerial vehicle; and switching from the first operation mode to the second operation mode based on the determined ambient condition information.

In Example 46, the method of Example 45 may optionally include that the ambient condition information include dust information representing a dust pollution in the vicinity of the unmanned aerial vehicle.

In Example 47, the method of Example 45 may optionally include that the ambient condition information include weather information representing rain in the vicinity of the unmanned aerial vehicle.

In Example 48, the method of any one of Examples 45 to 47 may optionally include that the ambient condition information are determined via one or more sensors of the unmanned aerial vehicle.

In Example 49, the method of Example 43 or 44 may optionally include: determining flight operation information associated with a flight operation of the unmanned aerial vehicle; and switching from the first operation mode to the second operation mode based on the determined flight operation information.

In Example 50, the method of Example 49 may optionally include that the flight operation includes a lift-off operation and/or a landing operation.

In Example 51, the method of Example 49 may optionally include that the flight operation includes a rain operation or a dusty environment operation.

While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes, which come within the meaning and range of equivalency of the claims, are therefore intended to be embraced.

What is claimed is:

1. An unmanned aerial vehicle, comprising:
    a cooling structure configured to dissipate heat;
    an air channel configured to dissipate heat from the cooling structure via an airflow;
    at least one fan configured to provide the airflow through the air channel;
    one or more sensors configured to receive ambient condition information associated with an ambient condition in a vicinity of the unmanned aerial vehicle; and
    one or more processors configured to trigger a reduction of the airflow through the air channel based on the ambient condition information,
    wherein the ambient condition information comprises dust information indicating a dust pollution in the vicinity of the unmanned aerial vehicle and/or weather information indicating rain in the vicinity of the unmanned aerial vehicle.

2. The unmanned aerial vehicle of claim 1, further comprising:
    at least one electronic device,
    wherein the cooling structure is configured to dissipate heat from the at least one electronic device.

3. The unmanned aerial vehicle of claim 2,
    wherein the one or more processors are further configured to reduce a computing load associated with at least one computing function of the at least one electronic device, based on the ambient condition information.

4. The unmanned aerial vehicle of claim 1, further comprising:
    at least one electronic device; and
    an imaging system,
    wherein the at least one electronic device comprises one image processor associated with the imaging system, and
    wherein the one or more processors are further configured to at least reduce a frame rate associated with the imaging system or disable the imaging system, based on the reduction of the airflow being triggered.

5. The unmanned aerial vehicle of claim 1, further comprising:
    at least one electronic device; and
    a collision detection and avoidance system,
    wherein the at least one electronic device is part of the collision detection and avoidance system, and
    wherein the one or more processors are further configured to reduce a dimension of a detection zone associated with the collision detection and avoidance system, based on the reduction of the airflow being triggered.

6. The unmanned aerial vehicle of claim 1,
    wherein the one or more sensors are configured to receive a signal indicating the ambient condition information, and
    wherein the signal indicating the ambient condition information is received from a flight controller of the unmanned aerial vehicle or from a remote control associated with the unmanned aerial vehicle.

7. The unmanned aerial vehicle of claim 1,
    wherein the one or more processors are configured to trigger a reduction of a rotational speed of the at least one fan to reduce the airflow.

8. The unmanned aerial vehicle of claim 1,
    wherein the one or more sensors comprise at least one rain sensor configured to detect rain in the vicinity of the unmanned aerial vehicle, and
    wherein the one or more processors are configured to trigger the reduction of the airflow based on rain being detected.

9. The unmanned aerial vehicle of claim 1,
    wherein the one or more sensors comprise at least one particle sensor configured to detect a particle concentration of solid particles and/or liquid particles in the vicinity of the unmanned aerial vehicle, and
    wherein the one or more processors are configured to trigger the reduction of the airflow based on the particle concentration in the vicinity of the unmanned aerial vehicle being greater than or equal to a predefined particle concentration threshold.

10. The unmanned aerial vehicle of claim 1, further comprising:
    a flap structure configured to control the airflow.

11. The unmanned aerial vehicle of claim 1,
wherein the cooling structure comprises:
a reservoir; and
at least one phase change material in the reservoir.

12. An unmanned aerial vehicle, comprising:
a cooling structure configured to dissipate heat;
an air channel configured to dissipate heat from the cooling structure via an airflow;
at least one fan configured to provide the airflow through the air channel;
one or more processors configured to:
receive a trigger signal, and
trigger a reduction of the airflow based on the trigger signal; and
a flap structure configured to control the airflow.

13. The unmanned aerial vehicle of claim 12, further comprising:
a flight controller to control flight of the unmanned aerial,
wherein the flight controller is configured to:
select between at least one first flight operation mode and at least one second flight operation mode, and
generate the trigger signal to trigger the reduction of the airflow based on the at least one second flight operation mode being selected.

14. The unmanned aerial vehicle of claim 12,
wherein the one or more processors are configured to receive the trigger signal from a remote controller associated with the unmanned aerial vehicle.

15. A method for operating an unmanned aerial vehicle, the method comprising:
determining ambient condition information associated with an ambient condition in a vicinity of the unmanned aerial vehicle; and
switching between a first operation mode and a second operation mode based on the ambient condition information,
wherein the first operation mode comprises:
cooling a cooling structure that is in an air channel via an airflow having a first volume flow rate, the cooling structure being configured to dissipate heat from at least one electronic device of the unmanned aerial vehicle,
wherein the second operation mode comprises:
providing an airflow through the air channel with a second volume flow rate, the first volume flow rate being greater than the second volume flow rate, and
wherein the ambient condition information comprises dust information indicating a dust pollution in the vicinity of the unmanned aerial vehicle and/or weather information indicating rain in the vicinity of the unmanned aerial vehicle.

16. The method of claim 15, further comprising:
determining flight operation information associated with a flight operation of the unmanned aerial vehicle,
wherein switching between the first operation mode and the second operation mode comprises:
switching from the first operation mode to the second operation mode further based on the flight operation information.

17. The method of claim 16,
wherein the flight operation comprises a lift-off operation, a landing operation, a rain operation, and/or a dusty environment operation.

18. A method for operating an unmanned aerial vehicle, the method comprising:
determining flight operation information associated with a flight operation of the unmanned aerial vehicle; and
switching between a first operation mode and a second operation mode based on the flight operation information,
wherein the first operation mode comprises:
cooling a cooling structure that is in an air channel via an airflow having a first volume flow rate, the cooling structure being configured to dissipate heat from at least one electronic device of the unmanned aerial vehicle, and
wherein the second operation mode comprises:
providing an airflow through the air channel with a second volume flow rate, the first volume flow rate being greater than the second volume flow rate.

19. The method of claim 18,
wherein the flight operation comprises a lift-off operation, a landing operation, a rain operation, and/or a dusty environment operation.

20. The method of claim 18,
wherein providing the airflow through the air channel with the second volume flow rate comprises:
generating a trigger signal to adjust at least one positionable flap from a first position to a second position.

* * * * *